United States Patent
Fuglestad et al.

(10) Patent No.: US 10,069,059 B2
(45) Date of Patent: Sep. 4, 2018

(54) METHOD AND APPARATUS FOR SHAKE AWAKE SMART BATTERY PACK

(71) Applicant: Inventus Power, Woodridge, IL (US)

(72) Inventors: Jason Fuglestad, Joliet, IL (US); Lucas H. Sturnfield, Downers Grove, IL (US); Ilyas Ayub, Villa Park, IL (US); Rogelio Colin, Aurora, IL (US)

(73) Assignee: INVENTUS POWER, Woodridge, IL (US)

( * ) Notice: Subject to any disclaimer, the term of this patent is extended or adjusted under 35 U.S.C. 154(b) by 238 days.

(21) Appl. No.: 15/153,634

(22) Filed: May 12, 2016

(65) Prior Publication Data

US 2017/0331028 A1     Nov. 16, 2017

(51) Int. Cl.

| | |
|---|---|
| *H02J 7/00* | (2006.01) |
| *H01M 10/44* | (2006.01) |
| *H01M 10/46* | (2006.01) |
| *H01L 41/113* | (2006.01) |
| *H01L 27/20* | (2006.01) |
| *H01L 41/04* | (2006.01) |
| *H01M 10/42* | (2006.01) |
| *H01M 10/0525* | (2010.01) |

(52) U.S. Cl.
CPC .......... *H01L 41/113* (2013.01); *H01L 27/20* (2013.01); *H01L 41/042* (2013.01); *H01M 10/4257* (2013.01); *H01M 10/44* (2013.01); *H02J 7/0013* (2013.01); *H02J 7/0042* (2013.01); *H02J 7/0081* (2013.01); *H01M 10/0525* (2013.01); *H01M 2010/4271* (2013.01)

(58) Field of Classification Search
None
See application file for complete search history.

(56) References Cited

U.S. PATENT DOCUMENTS

| | | |
|---|---|---|
| 3,022,365 A | 2/1946 | Saurwein |
| 4,199,245 A | 4/1980 | Nakai et al. |
| 4,331,848 A | 5/1982 | Schneider, Jr. |
| 4,848,556 A | 7/1989 | Shah et al. |
| 7,181,750 B2 | 2/2007 | Nakata |
| 7,889,078 B2 | 2/2011 | Hovden |
| 2005/0017602 A1* | 1/2005 | Arms .................. B60C 23/0411 310/339 |
| 2005/0275379 A1* | 12/2005 | Tsukamoto ........... H02J 7/0031 320/134 |

(Continued)

FOREIGN PATENT DOCUMENTS

EP     1833103     9/2007

OTHER PUBLICATIONS

Hye Lyun Park, International Search Report for counterpart International Application:PCT/2017/032063, dated Aug. 22, 2017, Korea IP Office, Daejeon, Republic of Korea.

*Primary Examiner* — David V Henze-Gongola
(74) *Attorney, Agent, or Firm* — Babcock IP, PLLC

(57) ABSTRACT

A method and apparatus for waking a battery pack from a dormant mode via shaking. The battery pack has a piezo electric device coupled to a semiconductor control circuit providing a power path between a positive terminal of a battery cell and a boot input of an ASIC charge/discharge controller powered by the battery cell. Shaking of the piezo electric device energizes the semiconductor control circuit, which engages the power path to power the initial booting of the ASIC charge/discharge controller.

20 Claims, 1 Drawing Sheet

(56) References Cited

U.S. PATENT DOCUMENTS

2009/0230924 A1* 9/2009 Wright .................... H02J 7/32
320/148
2015/0207436 A1 7/2015 Lee et al.

\* cited by examiner

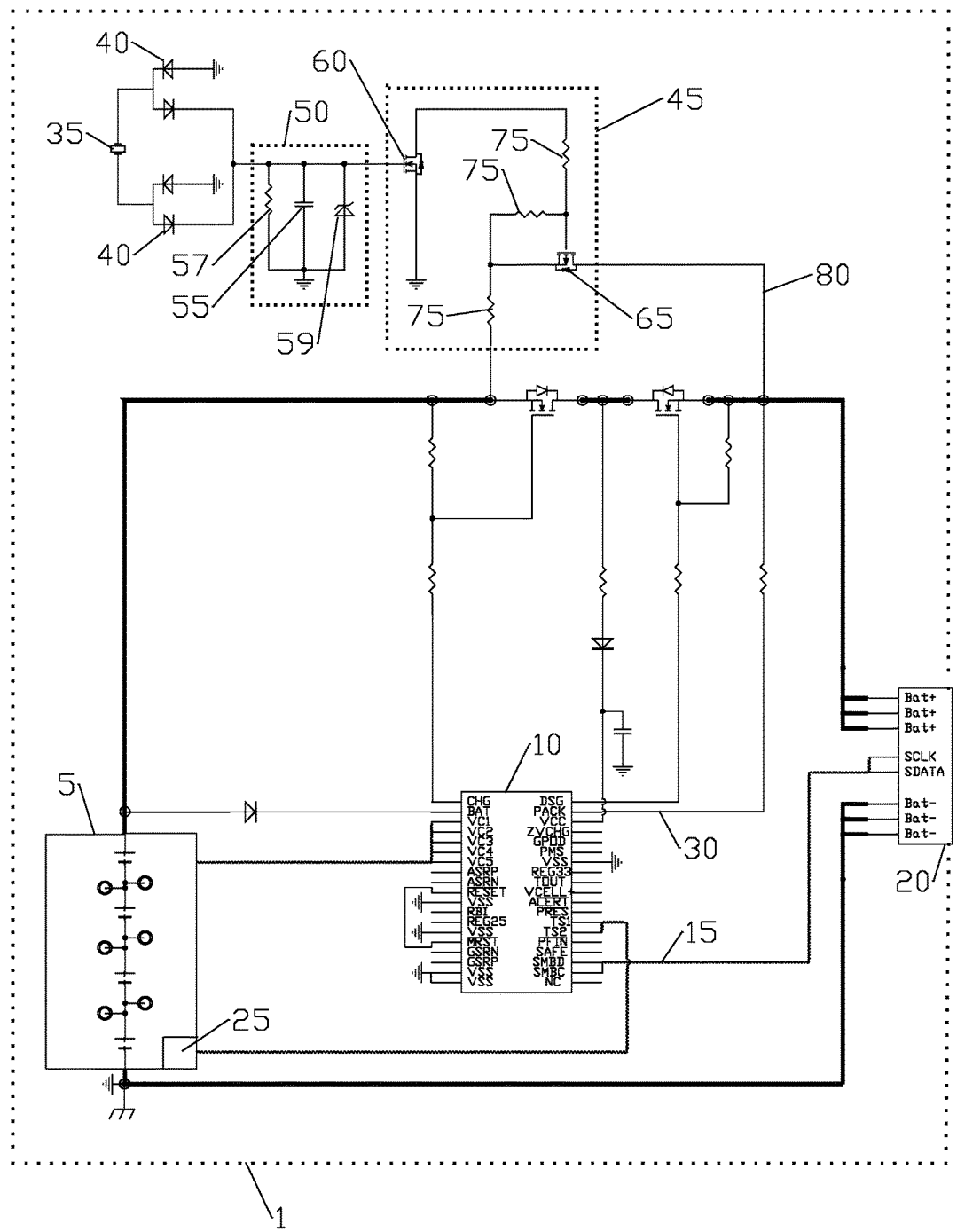

METHOD AND APPARATUS FOR SHAKE AWAKE SMART BATTERY PACK

BACKGROUND

Field of the Invention

The invention relates to electric battery packs. More specifically, the invention relates to a battery pack with a shake awake functionality operable to awaken the battery pack control circuitry from a zero power consumption dormant state.

Description of Related Art

Energy storage systems may utilize battery packs with on-board charge/discharge control and/or status/control communications functionality provided by control circuitry comprising a "fuel gauge" application specific integrated circuit (ASIC) operable as a charge/discharge controller integrated with the battery cells of the battery pack.

A common battery chemistry is Lithium-Ion. Lithium-Ion battery cells have desirable charge/discharge and power density characteristics. However, Lithium-Ion battery cells may be subject to significant degradation and/or damage from battery cell chemical reactions that occur at an increased rate if the battery cells are allowed to discharge below a minimum charge level. In addition to charge/discharge optimization, the ASIC charge/discharge controller may protect the battery cells by initiating system alarms and/or disabling further discharge of the battery pack as the minimum charge level is approached.

ASIC charge/discharge controllers typically include "sleep" or "standby" low power modes. Over extended periods even the lowered power consumption of an ASIC charge/discharge controller in "sleep" mode will eventually discharge the battery cells. To enable extended shelf-life of Lithium-Ion battery packs, with reduced risk of the battery pack discharging to below the minimum charge level, the battery pack may be configured for long term storage with the ASIC charge/discharge controller mechanically disconnected from the battery cells. However, to initialize such battery packs for first use, an additional mechanical switch and/or interconnection, such as connection with an additional external power source, may be required, complicating battery pack enclosure, usage procedures and/or manufacturing requirements.

Competition within the electrical power storage industry has focused attention upon increasing battery pack reliability, shelf life, battery cell longevity and overall system energy and cost efficiencies.

Therefore, it is an object of the invention to provide a method and apparatus that overcomes deficiencies in such prior art.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a schematic circuit diagram of a battery pack with shake awake functionality.

DETAILED DESCRIPTION

The inventors have devised a method and apparatus for waking a battery pack from a dormant mode via shaking. Thereby, additional interconnections, hardware and/or user training requirements to reliably initialize an entirely dormant battery pack for first use may be eliminated.

A schematic circuit diagram for an exemplary battery pack 1 with shake awake functionality is shown in FIG. 1. The battery pack 1 includes one or more battery cells 5, for example lithium-ion battery cells. An ASIC charge/discharge controller 10 monitors the battery cell(s) 5 status and controls charge/discharge modes of the battery cell(s) 5. The ASIC charge/discharge controller 10 may include a communications bus 15, such as system management bus (SMB), for status reporting and/or control of the battery pack 1 to/from an external system the battery pack 1 may be connected to via the battery pack interface 20. The communications bus 15 may also be used to deliver additional sensor data to/from the ASIC charge/discharge controller, such as temperature readings from the battery cell(s) via a thermistor 25 or the like.

The ASIC charge/discharge controller 10 is powered by the battery cell 5 via a primary power path 27, under control of the ASIC charge/discharge controller 10. For initial booting, the ASIC charge/discharge controller 10 includes a boot input 30, also known as the PACK pin. When the PACK pin is energized, the ASIC charge/discharge controller 10 engages internal power rail connections to open the primary power path 27, boots the central processing unit and energizes the analog front end (AFE) array of sensor inputs and charge/discharge control outputs. Once the ASIC charge/discharge controller 10 is booted, the boot input 30 no longer controls operation. The ASIC charge/discharge controller 10 may be shut down, for example, by command over the communications bus 15, detection of out of range battery cell 5 parameters and/or expiration of a desired time-out interval.

A piezo electric device 35 utilizes a piezo polymer film to generate a voltage and alternating current as the film is moved back and forth. A weight may be applied at the end of the film to induce inertial movements of the piezo vibration sensor as the battery pack 1, and thus the piezo electric device 35 therewithin, is shaken.

The electric power alternating current waveform generated by shaking of the piezo electric device 35 may be rectified by passage through a diode bridge 40 to achieve power transfer during both half-cycles of the alternating waveform. The rectified direct current from the piezo electric device 35 is then coupled to a semiconductor control circuit 45.

The semiconductor control circuit 45 may include a voltage conditioner 50 with a capacitor 55 between the diode bridge and the gate of a first transistor 60 to collect and store energy from a charge pulse from the piezo electric device 35. Additionally a bleed resistor 57 coupled to ground may be included to gradually dissipate the stored energy, to discharge the energy accumulated from shake pulses and otherwise discharge energy from indirect and inadvertent shaking/vibration of the battery pack 1. Further, the capacitance of the capacitor 55 may be selected to apply a minimum threshold of the shaking vigor necessary to power the semiconductor control circuit 45 and the amount of bleeder resistance can affect the duration that the semiconductor control circuit 45 remains active after a shake event. Over voltage damage to the semiconductor control circuit 45 from the diode bridge 40 rectified voltage, for example generated by application of excessive shaking to the battery pack 1, may be shunted to ground by adding a zener diode 59 to the conditioner 50.

Upon activation, the semiconductor control circuit 45 provides a time-constrained low-energy path from the battery cell(s) 5 to the PACK pin, powering and setting about the booting of the ASIC charge/discharge controller 10. During booting, further power paths are opened within the ASIC charge/discharge controller 10 to receive full power directly from the battery cell(s) 5. The battery cell(s) 5 are then used to further boot and then maintain the energized state of the ASIC charge/discharge controller 10, until such time that the battery cell(s) 5 approach a designated low power threshold, a safety event is detected, an activity timeout occurs, or a communications bus 15 command is received from an external device.

In the exemplary embodiment, the semiconductor control circuit 45 demonstrates use of a first transistor 60, for example an N-channel metal oxide semiconductor field effect transistor (MOSFET) that receives the piezo/voltage conditioner output pulse at the first transistor gate, momentarily opening a ground path across the first transistor 60 that is coupled to the gate of a second transistor 65, such as a P-channel MOSFET. The gate and the source of the second transistor 65 is also coupled to the positive terminal 70 of the battery cell(s) 5, via a resistor network 75 to limit current draw and apply a steady state voltage differential between the gate and the source. Thereby, absent the activation via the first transistor 60, the voltage at the second transistor gate is equal to the second transistor source, holding the second transistor in the off state.

When the second transistor 65 is activated, a boot power path 80 to the PACK pin of the ASIC charge/discharge controller 10 is initiated. Thereby, the semiconductor control circuit 45 controls the boot power path 80 to the PACK pin via the power resulting from shaking of the piezo electric device 35.

One skilled in the art will appreciate that operational control of the boot power path 80 exerted by the semiconductor control circuit 45 consumes power. However, as the ASIC charge/discharge controller 10 is itself powered by other connections (the primary power path 27, engaged by the ASIC charge/discharge controller 10, once the shake awake has occurred), this power consumption is only temporary and entirely generated by the piezo electric device 35 output (which does not use the battery cell(s) 5 power).

Shake awake functionality eliminates the need for providing physical access to the battery enclosure, enabling easy shake awake activation of assemblies the battery pack 1 may reside entirely within. Further, an environmental seal of the battery pack enclosure may be both enhanced and simplified by the removal of any surface switches or additional connection contacts.

Finally, because the only action required to activate the battery pack from the dormant state for immediate use is to shake it, the battery pack may be utilized with no additional element(s) or user training requirements.

Table of Parts

| | |
|---|---|
| 1 | battery pack |
| 5 | battery cell |
| 10 | ASIC charge/discharge controller |
| 15 | communications bus |
| 20 | battery pack interface |
| 25 | thermistor |
| 27 | primary power path |
| 30 | boot input |
| 35 | piezo electric device |
| 40 | diode bridge |
| 45 | semiconductor control circuit |
| 50 | voltage conditioner |
| 55 | capacitor |
| 57 | bleed resistor |
| 59 | zener diode |
| 60 | first transistor |
| 65 | second transistor |
| 70 | positive terminal |
| 75 | resistive voltage divider |
| 80 | boot power path |

Where in the foregoing description reference has been made to ratios, integers or components having known equivalents then such equivalents are herein incorporated as if individually set forth.

While the present invention has been illustrated by the description of the embodiment thereof, and while the embodiment has been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus, methods, and illustrative examples shown and described. Accordingly, departures may be made from such details without departure from the spirit or scope of applicant's general inventive concept.

Further, it is to be appreciated that improvements and/or modifications may be made thereto without departing from the scope or spirit of the present invention as defined by the following claims.

We claim:

1. A battery pack, comprising:
a piezo electric device coupled to a semiconductor control circuit;
an ASIC charge/discharge controller with a primary power path to a positive terminal of a battery cell;
the semiconductor control circuit operative to control a boot power path between the positive terminal of the battery cell and a boot input of the ASIC charge/discharge controller;
whereby shaking of the piezo electric device energizes the semiconductor control circuit, enabling the boot power path to power an initial boot of the ASIC charge/discharge controller, which then remains powered by the battery via the primary power path.

2. The battery pack of claim 1, further including a diode bridge electrically connected between the piezo electric device and the semiconductor control circuit;
the diode bridge configured to rectify an electric power output of the piezo electric device from an alternating current to a direct current.

3. The battery pack of claim 1, further including a voltage conditioner electrically connected between the piezo electric device and the semiconductor control circuit; the voltage conditioner configured to accumulate energy from the piezo electric device and provide energy at a pre-selected voltage level to the semiconductor control circuit.

4. The battery pack of claim 3, wherein the voltage conditioner includes a capacitor coupled to ground.

5. The battery pack of claim 3, wherein the voltage conditioner includes a dissipation resistor coupled to ground.

6. The battery pack of claim 3, wherein the voltage conditioner includes a zener diode coupled to ground.

7. The battery pack of claim 1, wherein the semiconductor control circuit includes an N-channel transistor and a P-channel transistor.

8. The battery pack of claim 7, wherein a gate of the N-channel transistor is coupled to the piezo electric device.

9. The battery pack of claim 7, wherein a source of the N-channel transistor is coupled to ground.

10. The battery pack of claim 7, wherein a drain of the N-channel transistor is coupled to a gate of the P-channel transistor.

11. The battery pack of claim 7, further including a resistor network electrically connected between a gate of the P-channel transistor and a source of the P-channel transistor and the positive terminal of the battery cell;
wherein a voltage received from the positive terminal of the battery cell at the gate of the P-channel transistor is less than or the same as a voltage received from the positive terminal of the battery cell at the source of the P-channel transistor.

12. The battery pack of claim 1, wherein the at least one battery cell is a lithium-ion battery cell.

13. A method for awakening a dormant ASIC charge/discharge controller, comprising:
shaking a piezo electric device coupled to a semiconductor control circuit;
responsive to the shaking, the piezo electric device generating electric power that activates the semiconductor control circuit to provide a boot power path between a positive terminal of a battery cell and a boot input of an ASIC charge/discharge controller powered by the battery cell, the ASIC charge/discharge controller then remaining powered via a primary power path to the battery.

14. The method of 13, further including a diode bridge electrically connected between the piezo electric device and the semiconductor control circuit;
the diode bridge rectifying an electric power output of the piezo electric device from an alternating current to a direct current.

15. The method of claim 13, further including a voltage conditioner electrically connected between the piezo electric device and the semiconductor control circuit; the voltage conditioner configured to accumulate energy from the piezo electric device and provide energy at a pre-selected voltage level to the semiconductor control circuit.

16. The method of 13, wherein the semiconductor control circuit includes an N-channel transistor and a P-channel transistor.

17. The method of claim 16, wherein a gate of the N-channel transistor is coupled to the piezo electric device.

18. The method of claim 16, wherein a source of the N-channel transistor is coupled to ground.

19. The method of claim 16, wherein a drain of the N-channel transistor is coupled to a gate of the P-channel transistor.

20. The method of claim 16, further including a resistor network electrically connected a gate and a source of the P-channel resistor and the positive terminal of the battery cell; wherein a voltage received from the positive terminal of the battery cell at the gate is the same as a voltage received from the positive terminal of the battery cell at the source.

* * * * *